(12) United States Patent
Saito et al.

(10) Patent No.: US 12,742,572 B2
(45) Date of Patent: Sep. 22, 2026

(54) HEAT STORAGE DEVICE AND METHOD FOR PRODUCING THE SAME

(71) Applicant: CANON KABUSHIKI KAISHA, Tokyo (JP)

(72) Inventors: Hiroshi Saito, Kanagawa (JP); Yoshinori Kotani, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 686 days.

(21) Appl. No.: 18/189,139

(22) Filed: Mar. 23, 2023

(65) Prior Publication Data

US 2023/0228460 A1 Jul. 20, 2023

Related U.S. Application Data

(63) Continuation of application No. PCT/JP2021/034708, filed on Sep. 22, 2021.

(30) Foreign Application Priority Data

Sep. 28, 2020 (JP) ................................ 2020-162586

(51) Int. Cl.

*F24S 70/20* (2018.01)
*B64G 1/50* (2006.01)
*F24S 60/00* (2018.01)
*H10F 77/67* (2025.01)
*B64G 1/10* (2006.01)

(52) U.S. Cl.

CPC ................ *F24S 70/20* (2018.05); *B64G 1/50* (2013.01); *H10F 77/67* (2025.01); *B64G 1/10* (2013.01); *F24S 60/00* (2018.05)

(58) Field of Classification Search

None

See application file for complete search history.

(56) References Cited

U.S. PATENT DOCUMENTS 3,362,467 A * 1/1968 Kummerer ............. G05D 23/01 236/1 R
4,005,698 A * 2/1977 Cuomo ................... F24S 70/25 427/160
4,148,294 A * 4/1979 Scherber ............... F24S 70/225 205/112
4,243,022 A * 1/1981 Pedone ................... F24S 10/55 126/658
4,267,218 A * 5/1981 Brugger .................. F24S 70/25 205/213
4,316,048 A * 2/1982 Woodall ................ H10F 77/955 136/253
4,582,111 A * 4/1986 Kuehn .................... F24S 70/25 164/46

(Continued)

FOREIGN PATENT DOCUMENTS

CN 101255588 A 9/2008
CN 102141310 A * 8/2011 .............. F24S 40/10

(Continued)

*Primary Examiner* — Jorge A Pereiro
(74) *Attorney, Agent, or Firm* — Canon U.S.A., Inc. IP Division

(57) ABSTRACT

A heat storage device including a metal layer containing a protrusion-and-recess-shaped object, in which the protrusion-and-recess-shaped object has an average height of 100 nm or more and 1,000 nm or less.

17 Claims, 10 Drawing Sheets

(56) References Cited

U.S. PATENT DOCUMENTS

| | | | | |
|---|---|---|---|---|
| 5,932,029 | A * | 8/1999 | Stone | F24S 40/55<br>136/253 |
| 2008/0152941 | A1* | 6/2008 | Hatanaka | C25D 11/12<br>257/E21.291 |
| 2011/0274878 | A1* | 11/2011 | Makino | G02B 1/113<br>428/141 |
| 2013/0222933 | A1* | 8/2013 | Eguro | F24S 23/70<br>359/838 |
| 2014/0041705 | A1* | 2/2014 | Kang | F24S 70/225<br>136/246 |
| 2017/0075044 | A1* | 3/2017 | Watanabe | C03C 17/366 |
| 2017/0167755 | A1* | 6/2017 | Liu | F24S 20/20 |
| 2018/0135850 | A1* | 5/2018 | Habib | C02F 1/14 |

FOREIGN PATENT DOCUMENTS

| | | | | |
|---|---|---|---|---|
| CN | 102473750 | A | 5/2012 | |
| CN | 108291743 | A | 7/2018 | |
| CN | 111249757 | A * | 6/2020 | B01D 17/02 |
| FR | 3016875 | A1 * | 7/2015 | F24S 70/20 |
| JP | 657155396 | A | 9/1982 | |
| JP | H077976 | B2 | 1/1995 | |
| JP | 2004261910 | A | 9/2004 | |
| JP | 2012007787 | A | 1/2012 | |
| WO | 2015114519 | A1 | 8/2015 | |
| WO | WO-2017073564 | A1 * | 5/2017 | F24V 99/00 |

* cited by examiner

20

1

6

5

9

HEAT STORAGE DEVICE AND METHOD FOR PRODUCING THE SAME

CROSS-REFERENCE TO RELATED APPLICATIONS

This application is a Continuation of International Patent Application No. PCT/JP2021/034708, filed Sep. 22, 2021, which claims the benefit of Japanese Patent Application No. 2020-162586, filed Sep. 28, 2020, both of which are hereby incorporated by reference herein in their entirety.

TECHNICAL FIELD

The present invention relates to a heat storage device and a method for producing the same.

BACKGROUND ART

In recent years, the use of light-absorbing heat-storing materials has been expanding in solar thermal power generation and space apparatuses. Desirably, light-absorbing heat-storing materials absorb electromagnetic waves (light) in the visible region and emit little electromagnetic waves (light) in the infrared region. Regarding a light-absorbing material, there is a black electroless nickel plating (for example, Non Patent Literature 1). Oxidizing a nickel plating on a surface of an object forms a fine protrusion-and-recess shape to blacken the surface, thereby resulting in a light-absorbing material. A technique has been disclosed for producing a resin having a surface with a microstructure by injection molding using a mold having a metal surface with a fine protrusion-and-recess shape (for example, Patent Literature 1).

CITATION LIST

Patent Literature

PTL 1: Japanese Patent Laid-Open No. 2004-261910

Non Patent Literature

NPL 1 "Black Electroless Nickel Plating", Journal of the Surface Finishing Society of Japan, Vol. 66, No. 11, 503-506, 2015

However, the black-colored material disclosed in Non Patent Literature 1 has a problem in that it emits a large amount of radiation even in the far-infrared region and does not exhibit excellent heat storage properties. The invention described in Patent Literature 1 relates to injection molding of a resin using a mold and cannot provide the formation of a highly versatile metal film, is difficult to use for various products, and has a problem in practical use.

SUMMARY OF INVENTION

The present invention has been made in view of the above problems and aims to provide a heat storage device that has characteristics of absorption of visible and near-infrared light (that is, low reflectance) and low radiation of far-infrared light (that is, high reflectance), which are normally incompatible, and a method for producing the heat storage device.

A heat storage device according to the present invention includes a heat storage member and a metal layer disposed over the heat storage member, the metal layer containing a protrusion-and-recess-shaped object, in which the protrusion-and-recess-shaped object has a height of 100 nm or more and 1,000 nm or less.

A method according to the present invention for producing a heat storage device includes a first step of forming a protrusion-and-recess shape of a metal oxide, a second step of forming, on the protrusion-and-recess shape of the metal oxide, a metal layer having a protrusion-and-recess shape corresponding to the protrusion-and-recess shape of the metal oxide, and a third step of bonding a heat storage member to a surface of the metal layer opposite to the protrusion-and-recess shape.

Further features of the present invention will become apparent from the following description of exemplary embodiments with reference to the attached drawings.

DESCRIPTION OF EMBODIMENTS

Embodiments of the present invention will be described in detail below.

Figure 2A:
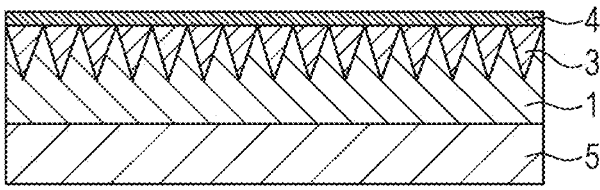
FIG. 2A is a schematic view illustrating an embodiment of a heat storage device of the present invention.

As illustrated in FIG. 2A, an embodiment of a heat storage device (for example, a heat storage tool or clothing) of the present invention includes a metal layer 1 containing a microscopically protrusion-and-recess-shaped object on a surface of a heat storage member 5, and the microscopically protrusion-and-recess-shaped object has a height of 100 nm or more and 1,000 nm or less (the term "microscopically protrusion-and-recess-shaped object" is also referred to simply as a "protrusion-and-recess-shaped object" or "finely protrusion-and-recess-shaped object"). The heat storage member 5 is an element that temporarily stores heat obtained by the metal layer 1. A heat storage material contained in the heat storage member 5 is not particularly limited as long as it has a high heat capacity, and may be a material containing any of water, paraffin, an oil, a fiber, sand, a salt, a metal, an alloy, and a metal oxide. As an alloy for the heat storage material, an Al—Si alloy is particularly desirable because it is excellent in heat storage. As a metal oxide for the heat storage material, magnesium oxide, calcium oxide, or lithium silicate is desirable because it is excellent in heat storage. As a metal for the heat storage material, aluminum is particularly desirable because it is excellent in heat storage. As a salt for the heat storage material, a sodium nitrate-potassium nitrate-sodium nitrite molten salt mixture, a hydroxide molten salt mixture, an alkali carbonate, or an alkali halide molten salt is particularly desirable because it is excellent in heat storage.

The heat storage member 5 may include a substrate (not illustrated) disposed between the metal layer 1 and the heat storage material. Examples of the shape of the substrate (not illustrated) include, but are not limited to, a flat plate shape, a film shape, and a sheet shape, as long as it can be a shape according to the intended use. Examples of a material for the substrate (not illustrated) include, but are not limited to, metals, glass, ceramic materials, wood, paper, and resins. Examples of resins include polyester, triacetylcellulose, cellulose acetate, poly(ethylene terephthalate), polypropylene, polystyrene, and polycarbonate. In addition, examples thereof include thermoplastic resins, such as poly(methyl methacrylate), ABS resins, poly(phenylene oxide), polyurethane, polyethylene, and poly(vinyl chloride). Further examples include thermosetting resins, such as unsaturated polyester resins, phenolic resins, crosslinked polyurethanes, crosslinked acrylic resins, and crosslinked saturated polyester resins.

Figure 2B:
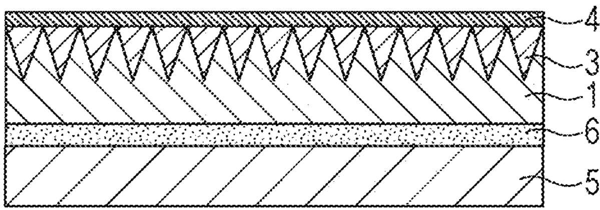
FIG. 2B is a schematic view illustrating an embodiment of a heat storage device of the present invention.

As illustrated in FIG. 2B, in another embodiment of the present invention, the metal layer 1 and the heat storage member 5 may be bonded with an adhesive layer 6. The adhesive layer 6 may be any layer that can bond the metal layer 1 and the heat storage member 5. Examples thereof include a layer composed of a cured adhesive resin (such as an epoxy resin) and double-sided tapes.

FIGS. 2A and 2B each illustrate a member (a member illustrated in FIG. 1C, as described below) including, over a surface of the metal layer 1, the fine protrusion-and-recess shape 3 of a transparent metal oxide and a metal oxide layer 4. However, instead of the film illustrated in FIG. 1C, the member may include a film illustrated in FIG. 1A or 1B, as described below.

High-electrical-conductivity metals, such as aluminum and nickel, have low radiation of far-infrared light and have heat storage properties, but do not exhibit light absorption properties. A fine protrusion-and-recess shape having a subwavelength structure smaller than the wavelength of visible light is known to have an antireflection effect, and is known to exhibit excellent wavelength band characteristics and incident angle characteristics owing to continuously varying space occupancy of the structure portion. When such a metal is allowed to have a fine protrusion-and-recessed surface, reflection from the metal surface is reduced in a wide wavelength region of visible light to reduce the reflectance in the entire visible light region. The surface appears black, and light absorption properties are exhibited. The use of a high-electrical-conductivity metal, such as aluminum or nickel, as the metal having such fine protrusions and recesses reduces far-infrared radiation. Thus, a metal member having a surface with a fine protrusion-and-recess structure is considered to be able to have both light absorption properties and heat storage properties. The visible region has a wavelength of, for example, 360 nm to 1,000 nm. Far-infrared light is in the wavelength range of, for example, 2 μm or more. Although the light-absorbing material disclosed in Non Patent Literature 1 has a surface with a fine protrusion-and-recess shape obtained by oxidation of a nickel surface, this material has large radiation (low reflectance) even in a far-infrared region, and does not exhibit heat storage properties. From this, the inventors have found that, in addition to the heat storage properties of a metal itself, a specific fine protrusion-and-recess shape of the metal surface is important for exhibiting the light absorption properties and the heat storage properties, and this finding has led to the completion of the present invention (the fine protrusion-and-recess shape is also referred to as a "microscopic protrusion-and-recess shape" or simply a "protrusion-and-recess shape").

The heat storage device of the present embodiment has a surface with the specific finely protrusion-and-recess-shaped object disposed on the metal layer and thus can exhibit both of the light absorption properties and the heat storage properties. The metal layer containing the finely protrusion-and-recess-shaped object of the heat storage device of the present embodiment preferably has a reflectance of 10% or less in the visible light region (550 nm) and a reflectance of 70% or more in the far-infrared light region (10 μm).

Most energy of sunlight is visible light. In the case of absorbing visible light, it is possible to more efficiently absorb the energy. When the temperature is increased by the energy absorption, far-infrared light is radiated to the surroundings to release energy. A material having small radiation in the far-infrared region can reduce the radiation of energy. In other words, a material having visible light absorption and low radiation of far-infrared light can efficiently absorb energy and can store heat while the release of energy is inhibited. Accordingly, the film disposed on the surface of the heat storage member of the heat storage device of the present embodiment has excellent heat storage properties, and it is possible to efficiently store heat in the heat storage material of the heat storage member in contact with the metal layer having excellent heat storage properties.

Metal Layer

Figure 1A:
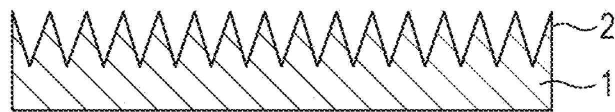
FIG. 1A is a schematic view illustrating an embodiment of a heat storage device of the present invention.

The metal layer of the heat storage device of the present embodiment will be described with reference to FIG. 1. As illustrated in FIG. 1A, an embodiment of the metal layer 1 is a film containing a finely protrusion-and-recess-shaped object 2 on its surface. As a material for the metal layer 1, a high-electrical-conductivity metal is preferred. Examples of the high-electrical-conductivity metal include silver, copper, gold, aluminum, magnesium, tungsten, cobalt, zinc, nickel, and chromium. Nickel, zinc, and chromium are preferred. Nickel is particularly preferred. The finely protrusion-and-recess-shaped object 2 disposed on the surface of the metal layer 1 is preferably composed of a high-electrical-conductivity metal, more preferably composed of the same metal as that of the metal layer 1. Moreover, the metal layer 1 is preferably a layer of plating, the layer being formed by plating.

The finely protrusion-and-recess-shaped object 2 is a microscopically protrusion-and-recess-shaped object disposed on one surface of the metal layer 1. The height of the finely protrusion-and-recess-shaped object 2 refers to the difference in height between the top point of a protruding portion and the bottom point of a recessed portion on the surface of the metal layer. The average height of the finely protrusion-and-recess-shaped object 2 is 100 nm or more and 1,000 nm or less, preferably 100 nm or more and 500 nm or less. The height of the finely protrusion-and-recess-shaped object 2 refers to the difference in height between a peak and a valley defined in "Definition and Presentation of Surface Roughness" of JIS-B-061, and corresponds to the maximum roughness (R max). In the film including the metal layer 1 of the present embodiment, the average surface roughness Ra' obtained by extension of the arithmetic average roughness Ra to a plane is preferably 1 nm or more and 50 nm or less on its surface. The average surface roughness Ra' value (nm) is obtained by applying the arithmetic average roughness Ra defined in JIS B 0601 to the measurement surface and extending it three dimensionally, is expressed as "a value obtained by averaging the absolute values of the deviation from the reference surface to a designated surface", and can be obtained by the following formula (1).

$$Ra' = \frac{1}{S_0}\int_{Y_B}^{Y_T}\int_{X_L}^{X_R}|F(X, Y) - Z_0|d_X d_Y \qquad \text{formula (1)}$$

In Formula (1), Ra' is the average surface roughness (nm), $S_0$ is the area $|X_R-X_L|\times|Y_T-Y_B|$ when the measurement surface is assumed to be ideally flat, and F(X, Y) is the height at the measurement point (X, Y) where the X coordinate is X and the Y coordinate is Y. $X_L$ to $X_R$ indicate the range of the X coordinates of the measurement surface, $Y_B$ to $Y_T$ indicate the range of the Y coordinates of the measurement surface, and $Z_0$ indicates the average height in the measurement surface.

Moreover, the film including the metal layer 1 of the present embodiment preferably has a surface with a specific surface area Sr of 1.0 or more and 3.0 or less. The specific surface area Sr is determined by the following formula (2).

$$Sr=S/S_0 \qquad \text{formula (2)}$$

In formula (2), $S_0$ is the surface area when the measurement surface is assumed to be ideally flat, and S is the surface area of the actual measurement surface.

The surface area of the actual measurement surface is determined as follows: The surface is divided into small triangles ΔABC composed of three closest data points (A, B, C). The area ΔS of each small triangle is determined using a vector product as described in the following formula (3). The sum total of the areas ΔS is determined and defined as the surface area S.

$$[\Delta S(\Delta ABC)]^2=[s(s-AB)(s-BC)(s-CA)] \qquad \text{formula (3)}$$

In formula (3), AB, BC, and CA are the lengths of the respective sides, and 2s=AB+BC+CA.

The height of the finely protrusion-and-recess-shaped object 2 can be determined by observing the cross section of the metal layer 1 with, for example, a scanning electron microscope. The average surface roughness Ra' and the specific surface area of the surface of the film including the metal layer of the heat storage device of the present invention can be determined by observing the surface of the film including the metal layer with, for example, a scanning probe microscope. In the film including the metal layer, a deposit may be present on the surface of the finely protrusion-and-recess-shaped object 2 (for example, a metal oxide described below). The average surface roughness Ra' and the specific surface area of the surface including the metal layer of the heat storage device are values including the deposit. In this specification, the film including the metal layer may be referred to as a "light-absorbing heat-storing film".

Figure 1B:
FIG. 1B is a schematic view illustrating an embodiment of a heat storage device of the present invention.
Figure 1C:
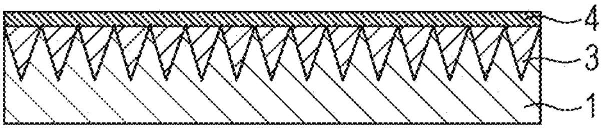
FIG. 1C is a schematic view illustrating an embodiment of a heat storage device of the present invention.

In another embodiment of the film including the metal layer (film provided with the metal layer) of the heat storage device of the present embodiment, as illustrated in FIG. 1B, a fine protrusion-and-recess shape 3 of a transparent metal oxide in close contact with the finely protrusion-and-recess-shaped object 2 may be disposed. In another embodiment of the film of the present embodiment, as illustrated in FIG. 1C, a transparent metal oxide layer 4 may be further disposed to cover a surface of the fine protrusion-and-recess shape 3 of the metal oxide, the surface being not in contact with the finely protrusion-and-recess-shaped object 2. Here, the close contact indicates that the metal oxide forming the fine protrusion-and-recess shape 3 of the metal oxide is filled into the space surrounded by the finely protrusion-and-recess-shaped object 2 and extends to the metal layer 1. When the fine protrusion-and-recess shape 3 and the metal oxide layer 4 are disposed over a surface of the finely protrusion-and-recess-shaped object 2, with regard to the average surface roughness Ra' and the specific surface area of the surface, the average surface roughness Ra' determined by extension of the arithmetic average roughness Ra to the surface is preferably 1 nm or more and 50 nm or less. The specific surface area Sr of the surface of the finely protrusion-and-recess-shaped object 2 is preferably 1.0 or more and 3.0 or less.

The material of the fine protrusion-and-recess shape 3 of the metal oxide is not particularly limited, but preferably contains alumina as a main component. More preferably, the material contains plate-like crystals containing alumina as a main component. The plate-like crystals containing alumina as a main component are formed of plate-like crystals containing an oxide or hydroxide of aluminum or a hydrate thereof as a main component, and are particularly preferably boehmite. The plate-like crystals containing alumina as a main component may be plate-like crystals composed only of alumina or may be plate-like crystals containing a trace amount of, for example, zirconium, silicon, titanium, or zinc in alumina plate-like crystals.

The finely protrusion-and-recess-shaped object 2 can be protected by disposing the fine protrusion-and-recess shape 3 of the metal oxide. When the fine protrusion-and-recess shape 3 of the metal oxide has a plate-like structure of the plate-like crystals containing alumina as a main component, preferably, the plate-like crystals containing alumina as a main component are arranged in a direction perpendicular to the surface direction of the metal layer 1 and have continuously varying spatial occupancy.

The material of the metal oxide layer 4 is not particularly limited, but preferably contains an amorphous gel of alumina. The metal oxide layer 4 enhances the hardness of the surface of the film of the present invention and decreases the light absorption properties. Thus, the thickness of the metal oxide layer 4 may be appropriately determined so as to satisfy the required hardness and light absorption properties.

The aluminum element, the silicon element, and the like in the finely protrusion-and-recess-shaped object 2, the fine protrusion-and-recess shape 3, and the metal oxide layer 4 can be detected by energy-dispersive X-ray analysis (EDX) at the time of surface or cross-sectional observation with a scanning electron microscope (SEM) or a transmission electron microscope (TEM). They can also be detected by, for example, X-ray photoelectron spectroscopy (XPS). The same applies to metal elements, such as silver, copper, gold, aluminum, magnesium, tungsten, cobalt, zinc, nickel, and chromium, in the metal layer 1. That is, they can be detected by measurement of energy-dispersive X-ray analysis (EDX) or X-ray photoelectron spectroscopy (XPS) at the time of surface or cross-sectional observation with the scanning electron microscope (SEM) or transmission electron microscope (TEM). When the finely protrusion-and-recess-shaped object 2, the fine protrusion-and-recess shape 3, or the metal oxide layer 4 is disposed, the proportions thereof vary in the direction perpendicular to the plane direction of the metal layer 1. That is, from the surface (metal oxide layer 4) toward the inside (metal layer 1), the proportion of the oxide of a metal, such as the aluminum element, relatively decreases, and the proportion of the metal element contained in the metal layer 1 and the finely protrusion-and-recess-shaped object 2 increases. Ultimately, only the metal element is detected.

Method for Producing Heat Storage Device

A method for producing a heat storage device of the present embodiment will be described below with reference to FIG. 3.

A method for producing a heat storage device of the present embodiment includes a first step of forming fine protrusion-and-recess shape of a metal oxide and a second step of forming the metal layer 1 on the fine protrusion-and-recess shape of the metal oxide. The method further includes a step of bonding the heat storage member 5 to a surface of the metal layer 1 opposite to the surface in contact with the fine protrusion-and-recess shape 3 of the metal oxide.

First Step: Step of Forming Fine Protrusion-and-Recess Shape of Metal Oxide

In the first step, the fine protrusion-and-recess shape of the metal oxide to be a mold is formed.

The material of the fine protrusion-and-recess shape of the metal oxide is not particularly limited, but preferably contains alumina as a main component. The fine protrusion-and-recess shape can be formed by a known vapor phase method, such as chemical vapor deposition (CVD) or physical vapor deposition (PVD), or a sol-gel liquid-phase method. By such a method, it is possible to form the fine protrusion-and-recess shape of the metal oxide containing plate-like crystals that contain alumina as a main component. Among them, a method is preferred in which an aluminum-containing film is treated with hot water to grow alumina plate-like crystals.

Examples of the film containing aluminum include an alumina gel film formed by applying a sol-gel coating solution containing an aluminum compound, and a metal aluminum-containing film formed by dry film formation, such as vacuum deposition or sputtering. The fine protrusion-and-recess shape of the metal oxide is preferably formed using the alumina gel film in terms of ease of adjustment of the reactivity and the height of the fine protrusion-and-recess shape of the metal oxide.

As a raw material of the alumina gel film, an aluminum compound, such as an aluminum alkoxide, an aluminum halide, or an aluminum salt can be used. From the viewpoint of film formability, it is preferable to use an aluminum alkoxide.

Examples of the aluminum compound include aluminum alkoxides, such as aluminum ethoxide, aluminum isopropoxide, aluminum-n-butoxide, aluminum sec-butoxide, aluminum tert-butoxide. Further examples thereof include oligomers of those aluminum alkoxides, aluminum halides, such as aluminum chloride, aluminum salts, such as aluminum nitrate, aluminum acetate, aluminum phosphate, and aluminum sulfate, aluminum acetylacetonate, and aluminum hydroxide.

The alumina gel film may contain an additional compound. Examples of another compound include alkoxides, halides, and salts of zirconium, silicon, titanium, and zinc, and combinations thereof. When the alumina gel film contains another compound, the height of the fine protrusion-and-recess shape of the metal oxide to be formed can be increased as compared with the case where the alumina gel film does not contain another compound.

The alumina gel film is formed on the base substrate by applying a sol-gel coating solution containing the aluminum compound, as described below. The sol-gel coating solution is prepared by dissolving the aluminum compound in an organic solvent. The amount of the organic solvent with respect to the aluminum compound is preferably about 20 times in terms of the mole ratio.

Examples of the organic solvent that can be used include alcohols, carboxylic acids, aliphatic hydrocarbons, alicyclic hydrocarbons, aromatic hydrocarbons, esters, ketones, ethers, and mixtures of these solvents. Examples of alcohols include methanol, ethanol, 2-propanol, butanol, 2-methoxyethanol, 2-ethoxyethanol, 1-methoxy-2-propanol, and 1-ethoxy-2-propanol. Further examples thereof include 1-propoxy-2-propanol, 4-methyl-2-pentanol, 2-ethylbutanol, 3-methoxy-3-methylbutanol, ethylene glycol, diethylene glycol, and glycerol. Examples of carboxylic acids include n-butyric acid, α-methylbutyric acid, isovaleric acid, 2-ethylbutyric acid, 2,2-dimethylbutyric acid, 3,3-dimethylbutyric acid, 2,3-dimethylbutyric acid, and 3-methylpentanoic acid. Further examples thereof include 4-methylpentanoic acid, 2-ethylpentanoic acid, 3-ethylpentanoic acid, 2,2-dimethylpentanoic acid, 3,3-dimethylpentanoic acid, 2,3-dimethylpentanoic acid, 2-ethylhexanoic acid, and 3-ethylhexanoic acid. Examples of aliphatic or alicyclic hydrocarbons include n-hexane, n-octane, cyclohexane, cyclopentane, and cyclooctane. Examples of aromatic hydrocarbons include toluene, xylene, and ethylbenzene. Examples of esters include ethyl formate, ethyl acetate, n-butyl acetate, ethylene glycol monomethyl ether acetate, ethylene glycol monoethyl ether acetate, and ethylene glycol monobutyl ether acetate. Examples of ketones include acetone, methyl ethyl ketone, methyl isobutyl ketone, and cyclohexanone. Examples of ethers include dimethoxyethane, tetrahydrofuran, dioxane, and diisopropyl ether. Among these, an alcohol is preferably used from the viewpoint of the stability of the sol-gel coating solution.

When the aluminum alkoxide is used as the aluminum compound, its high reactivity to water may cause rapid hydrolysis of the aluminum alkoxide due to moisture in air or the addition of water, thereby resulting in cloudiness of the sol-gel coating solution and precipitation. To prevent these problems, a stabilizer is preferably added to the sol-gel coating solution to stabilize the solution. Examples of the stabilizer that can be used include β-diketone compounds, β-ketoester compounds, and alkanolamines. Examples of β-diketone compounds include acetylacetone, trifluoroacetylacetone, hexafluoroacetylacetone, benzoylacetone, 3-methyl-2,4-pentanedione, and 3-ethyl-2,4-pentanedione. Examples of β-ketoester compounds include methyl acetoacetate, ethyl acetoacetate, butyl acetoacetate, hexyl acetoacetate, allyl acetoacetate, and benzyl acetoacetate. Further examples thereof include isopropyl acetoacetate, 2-methoxyethyl acetoacetate, sec-butyl acetoacetate, tert-butyl acetoacetate, and isobutyl acetoacetate. Examples of alkanolamines include monoethanolamine, diethanolamine, and triethanolamine. The amount of stabilizer with respect to the aluminum alkoxide is preferably about one time in terms of the mole ratio.

A catalyst may be used to promote the hydrolysis reaction of the aluminum alkoxide. Examples of the catalyst include nitric acid, hydrochloric acid, sulfuric acid, phosphoric acid, acetic acid, and ammonia.

If necessary, a water-soluble organic polymer compound may be added to the alumina gel film. The water-soluble organic polymer compound is easily eluted from the alumina gel film by immersion in hot water. This increases the reaction surface area between the aluminum compound and hot water, thereby enabling the formation of the fine protrusion-and-recess shape at a low temperature in a short period of time. For example, the height of the fine protrusion-and-recess shape formed can be controlled by changing the type and molecular weight of the organic polymer added. As the organic polymer, polyether glycols, such as polyethylene glycol and polypropylene glycol, are preferred because they are easily eluted from the alumina gel film by immersion in hot water. The amount of polyether glycol with respect to the weight of the aluminum compound in the alumina gel film is preferably in the range of 0.1 to 10 times in terms of the weight ratio.

Figure 3A:
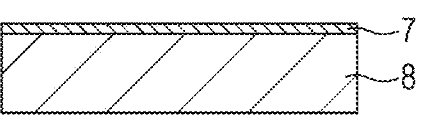
FIG. 3A is a process drawing illustrating an embodiment of a method for producing a heat storage device of the present invention.

A method for producing the fine protrusion-and-recess shape of the metal oxide will be described with reference to FIGS. 3A and 3B. An aluminum compound, optionally another compound, a stabilizer, and a water-soluble organic polymer compound are dissolved or suspended in an organic solvent to prepare a sol-gel coating solution. This sol-gel coating solution is applied onto a base substrate 8 and dried to form an alumina gel film as an aluminum-containing film 7. Alternatively, a metal aluminum-containing film as the aluminum-containing film 7 is formed on the base substrate 8 by dry film formation, such as vacuum deposition or sputtering. The material of the base substrate 8 is not particularly limited, and various materials, such as glass, plastic, and metal, can be used. When the alumina gel film is formed using a sol-gel coating solution that contains no stabilizer, the atmosphere in which the coating is performed is preferably an inert-gas atmosphere, such as dry air or dry nitrogen. The relative humidity of the dry atmosphere is preferably 30% or less. As a solution application method for forming the alumina gel film, for example, known application means, such as a dipping method, a spin coating method, a spray method, a printing method, a flow coating method, and a combination thereof, can be appropriately employed. The film thickness can be controlled by, for example, changing the withdrawal speed in the dipping method or the substrate rotation speed in the spin coating method, and by changing the concentration of the sol-gel coating solution. The drying may be performed at room temperature for about 30 minutes. It is also possible to perform drying or heat treatment at a higher temperature, as necessary. A higher heat-treatment temperature results in the formation of the stabler fine protrusion-and-recess shape 3 of the metal oxide in the following immersion treatment. The suitable thickness of the aluminum-containing film 7 is 100 nm or more and 600 nm or less, preferably 100 nm or more and 300 nm or less, more preferably 100 nm or more and 200 nm or less.

The aluminum-containing film 7 is then subjected to immersion treatment in hot water to form the fine protrusion-and-recess shape of alumina. By immersing the alumina gel film in hot water, the surface layer of the alumina gel film is subjected to deflocculation or the like, thereby eluting some components. However, plate-like crystals containing alumina as a main component are precipitated and grown on the surface layer of the alumina gel film because of solubility differences of various hydroxides in hot water, thereby forming the fine protrusion-and-recess shape 3 of the metal oxide. When a metal aluminum-containing film is used in place of the alumina gel film, aluminum reacts with hot water and is oxidized into alumina. Thereafter, as in the case of using the alumina gel film, the fine protrusion-and-recess shape 3 of the metal oxide is formed. Thus, when the material of the base substrate 8 mainly contains aluminum or alumina, the formation of the aluminum-containing film 7 on the base substrate 8 can be omitted. The temperature of the hot water is preferably 40° C. or higher and lower than 100° C. The immersion treatment time is preferably about 5 minutes to about 24 hours. In the immersion treatment of an alumina gel film to which a compound other than the alumina component is added, alumina is crystallized into plate-like crystals using the solubility difference of components in hot water. Unlike the immersion treatment of an alumina gel film containing a single alumina component, the size of the plate-like crystals can thus be controlled over a wide range by changing the composition of the inorganic components. Adjusting the thickness of the aluminum-containing film 7 can also be used to adjust the height of the fine protrusion-and-recess shape 3 of alumina. The average height of the fine protrusion-and-recess shape 3 of the metal oxide is preferably 100 nm or more and 1,000 nm or less, more preferably 100 nm or more and 500 nm or less. Accordingly, it is possible to control the fine protrusions and recesses formed by the plate-like crystals over the wide range described above.

Second Step: Formation Step of Metal Layer

In the second step, a metal layer is formed on the fine protrusion-and-recess shape of the metal oxide, thereby forming, on the metal layer, a finely protrusion-and-recess-shaped object to which the fine protrusion-and-recess shape has been transferred. The step of forming the metal layer 1 on the fine protrusion-and-recess shape 3 of the metal oxide will be described below with reference to FIG. 3C. As a method for forming the metal layer 1, metal plating process is preferred, and electroless plating process is more preferred. In the electroless plating process, activation is performed by applying an aqueous solution in which a palladium compound such as palladium chloride, a gold compound such as gold chloride, a silver compound such as silver chloride, a tin compound such as tin chloride, or the like is dissolved, to the fine protrusion-and-recess shape 3 of the metal oxide. The activation may be performed by immersing the fine protrusion-and-recess shape 3 of the metal oxide together with the base substrate 8 in the aqueous solution in which the palladium compound is dissolved. The metal layer 1 is then deposited on the fine protrusion-and-recess shape 3 of the metal oxide using an electroless plating solution. The metal ions in the electroless plating solution correspond to the metal layer of the metal layer of the present invention. An electroless plating solution containing nickel ions, chromium ions, and zinc ions is preferred. A nickel plating solution containing nickel ions is particularly preferred. The nickel plating solution may contain a phosphorus component or a boron component in addition to the nickel component. Examples of a commercially available nickel plating solution include Top Nicoron series available from Okuno Chemical Industries Co., Ltd. The temperature of the plating solution in the electroless plating process is preferably 30° C. or higher and 98° C. or lower, more preferably 50° C. or higher and 90° C. or lower. The time for performing the electroless plating process can be adjusted in accordance with the thickness of the metal layer to be formed, and is usually 30 seconds to 1 hour. In this way, the metal layer 1 is formed so as to fill the gap of the fine protrusion-and-recess shape, thereby forming the metal layer 1 including the finely protrusion-and-recess-shaped object 2 to which the fine protrusion-and-recess shape 3 of the metal oxide is transferred. As a result, the metal layer 1 has a protrusion-and-recess shape corresponding to the fine protrusion-and-recess shape 3 of the metal oxide.

The electroless plating process is preferably performed in such a manner that the metal layer 1 including the finely protrusion-and-recess-shaped object 2 has a thickness of 200 nm or more and 15,000 nm or less. The average height of the finely protrusion-and-recess-shaped object 2 corresponds to the average height of the fine protrusion-and-recess shape 3 of the metal oxide, and is 100 nm or more and 1,000 nm or less. When the metal layer 1 including the finely protrusion-and-recess-shaped object 2 has a thickness of 200 nm or more, the light-absorbing heat-storing film of the present invention exhibits excellent light absorption and heat storage properties.

After the above-described electroless plating process is performed, in order to increase the thickness of the metal layer 1, an electroplating process may be performed on the surface of the metal layer 1 opposite to the surface on which the finely protrusion-and-recess-shaped object 2 is disposed. For the electroplating process, a known electroplating solution can be used. For example, an electroplating solution containing nickel ions, iron ions, copper ions, or the like as metal ions can be used. When the electroplating process is performed using the same metal as the metal of the metal layer 1, the thickness of the metal layer can be increased by the electroplating process. When the electroplating process is performed using a metal different from the metal of the metal layer 1, the metal layer formed by the electroplating process serves as the heat storage member 5. In addition to the inorganic salt serving as the raw material of the metal ions, an electrically conductive salt, a salt for adjusting a counter ion, a carboxylic acid-based additive for improving the uniformity of a film of plating, a brightener, and the like may be added to the electroplating solution as necessary. In the electroplating step, the thickness of the metal layer 1 can be set to a desired thickness by adjusting the solution temperature of the electroplating solution, the current density, and the plating time. If necessary, before the electroplating step, a surface of the metal layer 1 opposite to the surface on which the finely protrusion-and-recess-shaped object 2 is disposed may be subjected to activation treatment with an aqueous solution containing an acid or the like. To improve the quality of the film formed by the electroplating treatment step, a step of removing foreign matter in the electroplating solution may be included in addition to a step of stirring the electroplating solution during the electroplating treatment.

Third Step: Step of Bonding Heat Storage Member

Figure 3E:
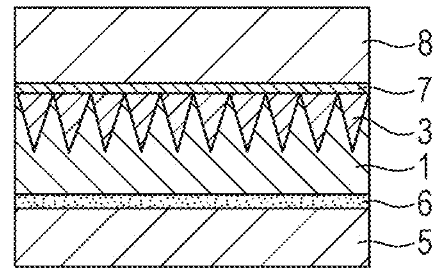
FIG. 3E is a process drawing illustrating an embodiment of a method for producing a heat storage device of the present invention.
Figure 3B:
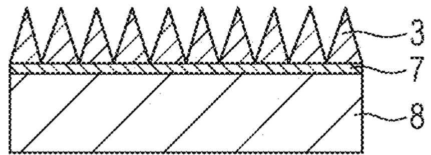
FIG. 3B is a process drawing illustrating an embodiment of a method for producing a heat storage device of the present invention.
Figure 3F:
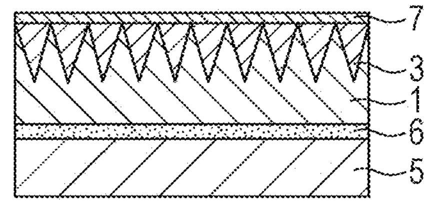
FIG. 3F is a process drawing illustrating an embodiment of a method for producing a heat storage device of the present invention.
Figure 3C:
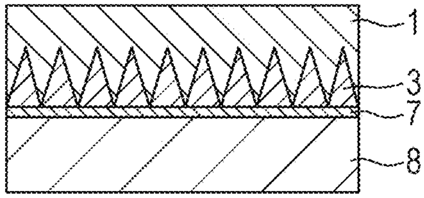
FIG. 3C is a process drawing illustrating an embodiment of a method for producing a heat storage device of the present invention.
Figure 3G:
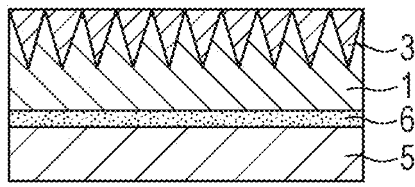
FIG. 3G is a process drawing illustrating an embodiment of a method for producing a heat storage device of the present invention.
Figure 3D:
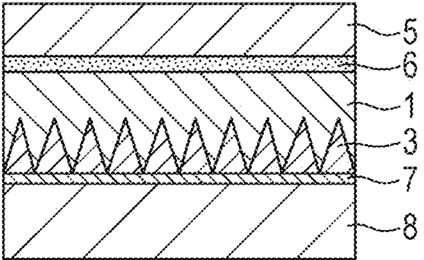
FIG. 3D is a process drawing illustrating an embodiment of a method for producing a heat storage device of the present invention.

In the method for producing the heat storage device of the present embodiment, as illustrated in FIG. 3D, the heat storage member 5 is bonded to a surface of the metal layer 1 opposite to the surface on which the finely protrusion-and-recess-shaped object 2 is disposed. As the shape and material of the heat storage member 5, those described above can be used. When the material of the substrate of the heat storage member 5 is a metal, a metal serving as the substrate of the heat storage member 5 may be further stacked on the surface of the metal layer 1 opposite to the surface on which the finely protrusion-and-recess-shaped object 2 is disposed. Regarding a method for stacking the metal, the metal may be stacked by the above-described electroplating treatment, or may be stacked by physical vapor deposition such as sputtering. When the material of the substrate of the heat storage member 5 is a resin, the heat storage member may be formed by depositing a resin to be heat storage member 5 on a surface of the metal layer 1 opposite to fine protrusion-and-recess shape 3 of the metal oxide and then curing the resin. The heat storage member 5 may be bonded to the metal layer 1 with the adhesive layer 6. The adhesive used for the adhesive layer 6 is not particularly limited as long as it is a material that firmly bonds the heat storage member 5 and the metal layer 1 together.

Fourth Step: Etching Step

The etching step will be described in detail by taking a heat storage device including the heat storage member 5 and the adhesive layer 6 as illustrated in FIGS. 3E to 3H. Etching may be performed while only the substrate of the heat storage member 5 is bonded, and then the heat storage material may be attached to the substrate to form the heat storage member. Alternatively, etching is performed in a state in which only the substrate of the heat storage member 5 is provided without the adhesive layer 6, and then the heat storage material may be attached to the substrate to form the heat storage member. FIG. 3E is an upside-down view of the heat storage device illustrated in FIG. 3D.

Figure 3H:
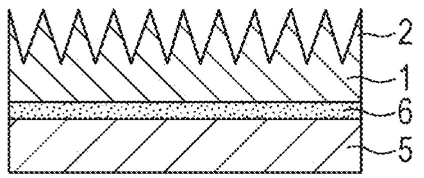
FIG. 3H is a process drawing illustrating an embodiment of a method for producing a heat storage device of the present invention.

To obtain the heat storage device of the present embodiment, the base substrate 8 is removed, as illustrated in FIG. 3F. After the removal of the base substrate 8, the heat storage device includes the aluminum-containing film 7 on its surface. When the aluminum-containing film 7 is a metal aluminum-containing film, the metal aluminum reflects visible light; thus, the metal aluminum-containing film needs to be removed by etching, as illustrated in FIG. 3G. When the aluminum-containing film 7 is an alumina gel film, the alumina gel film is the metal oxide layer 4 of the heat storage member. Thus, the alumina gel film may be removed by etching so as to satisfy the surface hardness and light absorption properties required. As an etching method, wet etching is preferred in which the aluminum-containing film 7 is dissolved using an acid or alkali solution. Examples of the acid include hydrochloric acid, nitric acid, and sulfuric acid. Examples of the alkali include sodium hydroxide and potassium hydroxide. From the viewpoint of work efficiency, an etching method using an alkali solution is more preferred. The concentration of a solution used for the etching is preferably in the range of several percent to several tens of percent, and the etching time is preferably in the range of several hours to several days. As illustrated in FIG. 3H, the fine protrusion-and-recess shape 3 of the metal oxide may also be removed by etching. The heat storage device in which the metal layer 1 including the finely protrusion-and-recess-shaped object 2 on the outermost surface is bonded to the heat storage member 5 with the adhesive layer 6 provided therebetween achieves particularly excellent light absorption properties.

The residue of the metal oxide, such as alumina, after etching (the metal oxide attached to the metal layer) can be detected by, for example, EDX or XPS measurement during surface or cross-sectional observation with a SEM or TEM.

As described above, the degree of the etching treatment may be adjusted according to the desired balance between the light absorption and heat storage performance and the surface hardness of the heat storage member or the metal layer. Alternatively, the etching step, which is the present step, may be performed before the step of bonding the heat storage member 5, which is the third step, is performed, and then the heat storage member 5 may be bonded.

The heat storage device of the present embodiment obtained as described above include the metal layer 1 including the finely protrusion-and-recess-shaped object 2 and thus absorb visible light, thereby resulting in low reflectance in the visible light region and low radiation of far-infrared light. This results in high reflectance in the far-infrared region and can achieve excellent light absorption and heat storage properties.

The film (light-absorbing heat-storing film) containing the metal layer 1 of the present embodiment can be disposed on a surface of any of various members. The light-absorbing heat-storing film of the present embodiment can also be formed on a surface of a fabric to make a garment having heat storage properties. The light-absorbing heat-storing film of the present embodiment may be used as a decorative film for heat storage. For example, the light-absorbing heat-storing film of the present invention can be disposed, as a decorative film for heat storage, on a surface of an interior of a vehicle, an electronic device, such as a mobile device or a home appliance, a parasol, or a tent. Various adhesives can be used when the light-absorbing heat-storing film of the present invention is disposed on a surface of the member or the heat storage device. Accordingly, the light-absorbing heat-storing film of the present invention can be disposed on the surface of each of the member and the heat storage device according to the purpose of use. The surface of each of the member and the heat storage device is not limited to a flat surface and may have a two-dimensionally or three-dimensionally curved surface.

A heat insulator is desirably disposed on the light-absorbing heat-storing film or around the heat storage member of the present embodiment because the heat storage properties are further improved. A heat insulator that transmits light is more desirable because of its higher light absorption efficiency.

The heat storage device of the present embodiment has excellent light absorption and heat storage properties and thus can be used for various articles. For example, the heat storage device can be used for a solar water heating system because the energy of sunlight can be efficiently used. When the heat storage device is used in the solar water heating system, a steam-generating pipe (not illustrated) is passed through the heat storage member 5. During the time when sunlight is not available, such as at night, an unheated heating medium is allowed to flow through the steam-generating pipe, so that the heating medium can be heated by the heat storage material whose temperature has increased and which is contained in the heat storage member 5.

Since the heat storage device of the present embodiment has excellent heat storage properties, the energy of sunlight can be efficiently used. Thus, the heat storage device can be used in a solar thermal power generation system. When the heat storage device is used in the solar thermal power generation system, a steam-generating pipe (not illustrated) is passed through the heat storage member 5. During the time when sunlight is not available, such as at night, an unheated heating medium is allowed to flow through the steam-generating pipe, and the heating medium can be heated by the heat storage material whose temperature has increased and which is contained in the heat storage member 5. The heated heating medium can generate steam in a steam generator (not illustrated) to operate a steam turbine (not illustrated), thereby generating electricity.

Since the heat storage device of the present embodiment has excellent heat storage properties, the energy of sunlight can be efficiently used. Thus, the heat storage device can be used for an artificial satellite. The artificial satellite has a large temperature difference between a surface on which sunlight is incident and a surface on which sunlight is not incident. The temperature difference can be reduced by storing heat when sunlight is incident and radiating heat when sunlight is not incident, which is desirable. For example, the temperature difference can be reduced with an apparatus including two devices: the heat storage device of the present embodiment and a heat dissipation device, as described below. When the temperature of the artificial satellite is low, the heat storage device of the present embodiment is exposed to the outside by a means of exposing the heat storage device to the outside, so that heat is stored, thereby inhibiting a decrease in temperature. At a high temperature, the heat dissipation device is exposed to the outside by a means of exposing the heat dissipation device to the outside, so that heat is dissipated, thereby inhibiting an increase in temperature. The means of exposing the heat storage device to the outside and the means of exposing the heat dissipation device to the outside may be the same or different. Such use can greatly reduce the power consumption of a heater for heat retention.

Figure 8:
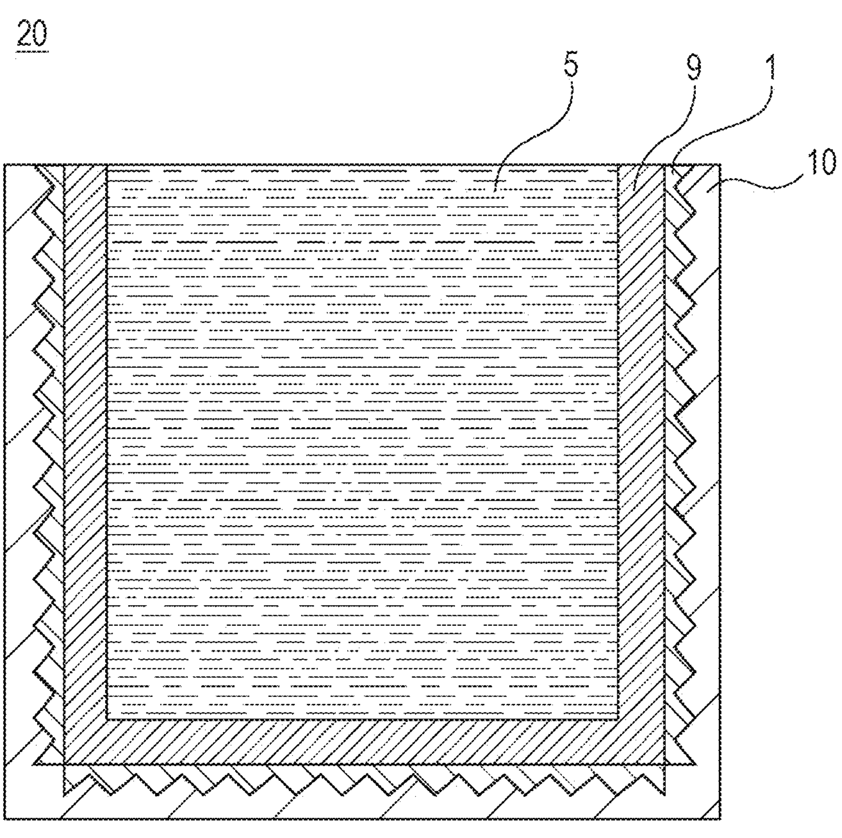
FIG. 8 is a schematic view illustrating an embodiment of an article of the present invention.

Since the heat storage device of the present embodiment has excellent heat storage properties, the energy of sunlight can be efficiently used. Thus, the heat storage device can be used for a solar collector or solar pot. FIG. 8 illustrates a solar collector as an example of an article 20 including a heat storage device. In the article 20 as a solar collector, for example, water can be used as the heat storage member 5. The heat storage member 5 (water) is contained in a container 9. The metal layer 1 is disposed outside the container 9. The container 9 is located between the heat storage member 5 and the metal layer 1. A heat insulator 10 is disposed outside the metal layer 1. The metal layer 1 is located between the heat insulator 10 and the heat storage member 5. For example, xerogel can be used as the heat insulator 10. Thereby, solar heat can be stored in the water (heat storage member 5) contained in the container 9.

Figures 9A, 9B:
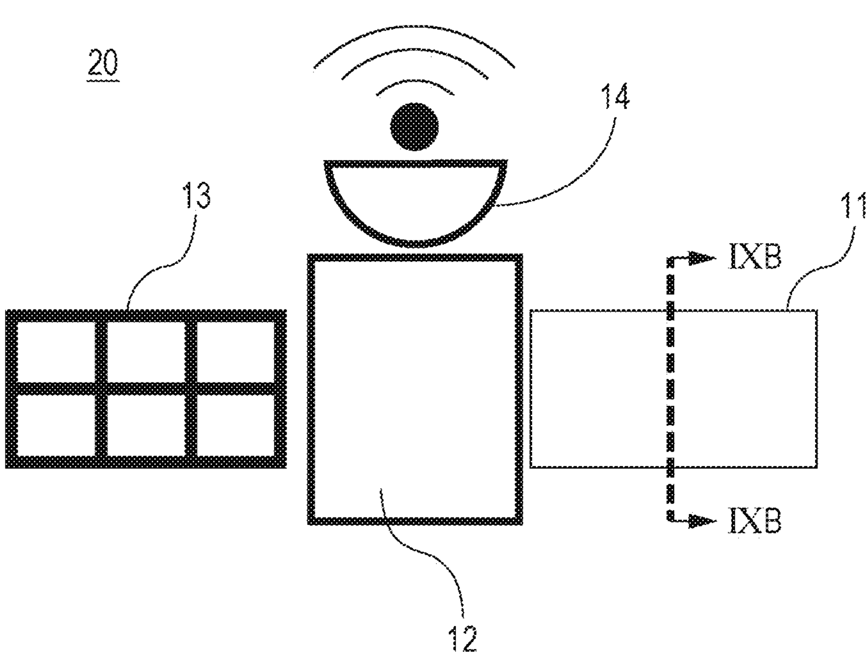
FIG. 9A is a schematic view illustrating an embodiment of an article of the present invention.
FIG. 9B is a schematic view illustrating an embodiment of an article of the present invention.

FIG. 9A illustrates an artificial satellite as an example of article 20 including a heat storage device. The article 20 as the artificial satellite includes a heat controller 11, a controller 12, a power generator 13, and a communication device 14. FIG. 9B is a cross-sectional view of the heat controller 11 taken along line IXB-IXB in FIG. 9A. The metal layer 1 is disposed over the heat storage member 5. The metal layer 1 is bonded to the container 9 containing the heat storage member 5 with the adhesive layer 6 interposed between the metal layer 1 and the heat storage member 5. As the heat storage member 5, for example, paraffin can be used. The heat controller 11 can store heat with sunlight.

The article 20, such as an artificial satellite, can include a heat dissipation device. When a predetermined portion (for example, the controller 12) of the article 20 has a temperature of lower than a predetermined temperature (low temperature), heat can be stored in the heat storage device of the heat controller 11. When the predetermined portion (for example, the controller 12) has a temperature equal to or higher than the predetermined temperature (high temperature), heat can be dissipated from the heat dissipation device. In the article 20 as the artificial satellite, at least one of deformation or displacement can be performed so as to switch between the heat storage and the heat dissipation. For example, a heat storage shape is a shape in which the heat storage device faces the outside of the artificial satellite (for example, a side opposite to the controller 12) and the heat dissipation device faces the inside of the artificial satellite (for example, a side adjacent to the controller 12). The heat dissipation shape is a shape in which the heat dissipation device faces the outside of the artificial satellite (for example, a side opposite to the controller 12) and the heat storage device faces the inside of the artificial satellite (for example, a side adjacent to the controller 12). The artificial satellite can be deformed so as to switch between the heat storage shape and the heat dissipation shape. Alternatively, the artificial satellite can be displaced so as to take an attitude in which the heat storage device faces a heat source (for example, the sun) around the artificial satellite and the heat dissipation device faces a side (for example, the earth) opposite to the heat source around the artificial satellite.

The heat storage device of the present embodiment can be used for hybrid solar photovoltaic power generation in combination with a solar photovoltaic power generation cell. The solar photovoltaic power generation cell can be composed of, for example, silicon, an organic semiconductor material, or an organic-inorganic perovskite semiconductor material. In a hybrid solar photovoltaic power generation unit in which the solar photovoltaic power generation cell is disposed on the heat storage device, the heat storage device absorbs light transmitted through the solar photovoltaic power generation cell and inhibits radiation. This enables efficient heat storage and utilization of solar heat. The hybrid solar photovoltaic power generation unit is desirably sealed in a vacuum. Sealing in a vacuum can inhibit heat conduction, so that heat can be stored more efficiently, which is desirable. A heat insulator that transmits light is desirably provided for hybrid solar photovoltaic power generation. As the heat insulator that transmits light, for example, aerogel or xerogel can be used.

Figure 10:
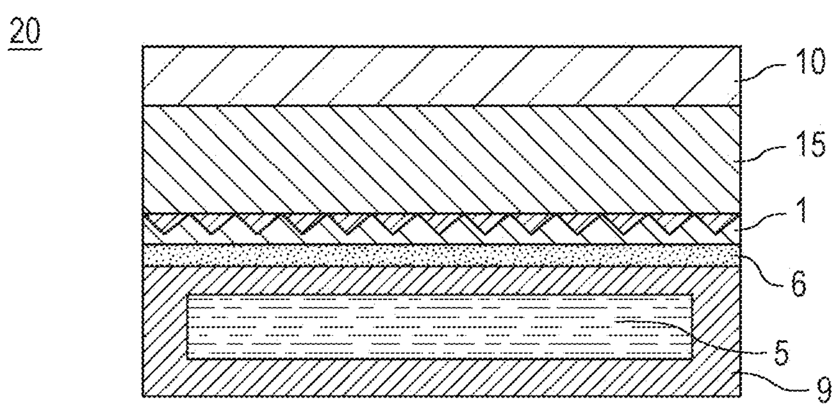
FIG. 10 is a schematic view illustrating an embodiment of an article of the present invention.

FIG. 10 illustrates a solar panel as an example of the article 20 including a heat storage device. In the article 20 as a solar panel, for example, oil can be used as the heat storage member 5. The heat storage member 5 (oil) is contained in the container 9. A metal layer 1 is disposed over the outside of the container 9. The container 9 is located between the heat storage member 5 and the metal layer 1. The metal layer 1 is bonded to the heat storage member 5 with the adhesive layer 6 interposed therebetween. The adhesive layer 6 is located between the container 9 and the metal layer 1. A solar photovoltaic power generation cell 15 is disposed outside the metal layer 1. Silicon can be used for the solar photovoltaic power generation cell 15. The metal layer 1 is located between the solar photovoltaic power generation cell 15 and the heat storage member 5. The heat insulator 10 is disposed outside the solar photovoltaic power generation cell 15. The solar photovoltaic power generation cell 15 is located between the heat insulator 10 and the metal layer 1. The solar photovoltaic power generation cell 15 is located between the heat insulator 10 and the heat storage member 5 and the heat storage device including the metal layer 1 disposed over the heat storage member 5. For example, vacuum-sealed glass can be used as the heat insulator 10. Thereby, the hybrid solar photovoltaic power generation system is configured, and power generation and heat storage can be performed with sunlight.

A system using thermal energy of the sun can be referred to as a "solar heat utilization system". The solar heat utilization system is the above-mentioned solar water heating system or solar thermal power generation system. The solar heat utilization system includes the heat storage device of the present embodiment. The solar heat utilization system includes an article including the heat storage device. The article including the heat storage device can include a heat insulator and a heat dissipation device, in addition to the heat storage device. The heat insulator and the heat dissipation device in the article including the heat storage device can be fixed to the heat storage device. The solar heat utilization system may include other articles, such as a pipe, a heating medium, and a steam turbine, in addition to the article including the heat storage device. Other articles in the solar heat utilization system need not be fixed to the article including the heat storage device.

A system using the light energy of the sun can be referred to as a "sunlight utilization system". The sunlight utilization system is the above-described solar photovoltaic power generation system or a sunlight lighting system. A sunlight utilization system includes the heat storage device of the present embodiment. The sunlight utilization system includes an article including the heat storage device. The article including the heat storage device can include a heat insulator and a heat dissipation device, in addition to the heat storage device. The heat insulator and the heat dissipation device in the article including the heat storage device can be fixed to the heat storage device. The sunlight utilization system may include other articles, such as lines, batteries, and power conditioners, in addition to the article including the heat storage device. Other articles in the solar sunlight utilization system need not be fixed to the article including the heat storage device.

The solar heat utilization system and the sunlight utilization system can also be referred to as "solar systems". The solar systems may include solar collectors, solar pots, and solar panels.

EXAMPLES

The present invention will be described below by examples.

The present invention is not limited to the following examples.

A lens reflectance measuring device (trade name: USPM-RU III, available from Olympus Corporation) was used for the reflectance spectrum measurement in the visible light region in Examples.

A Fourier transform infrared spectrophotometer (FT/IR-6600, available from JASCO Corporation) was used for the reflectance spectrum measurement in the infrared region in Examples.

Example 1

Aluminum sec-butoxide (hereinafter, also referred to as "Al(O-sec-Bu)$_3$") and ethyl acetoacetate (hereinafter, also referred to as "EtOAcAc") were dissolved in 2-propanol (hereinafter, also referred to as "IPA") and stirred at room temperature for about 3 hours to prepare an alumina sol solution. The mole ratio of the components in the alumina sol solution was $Al(O\text{-sec-}Bu)_3$:EtOAcAc:IPA=1:1:20. A 0.01 M dilute hydrochloric acid was added to the alumina sol solution in such a manner that the amount of hydrochloric acid added was two times with respect to $Al(O\text{-sec-}Bu)_3$ in terms of the mole ratio, and the mixture was refluxed for about 6 hours to prepare a sol-gel coating solution. The sol-gel coating solution was applied onto a quartz glass substrate serving as a base substrate by a spin coating method to form a coating film. Thereafter, the coating film was heat-treated at 100° C. for 1 hour to provide a transparent alumina gel film. The alumina gel film was immersed in hot water at 80° C. for 30 minutes and then dried at 100° C. for 10 minutes to form an alumina layer having a fine protrusion-and-recess shape.

An aqueous palladium chloride solution was applied onto the alumina layer having the fine protrusion-and-recess shape by a spin coating method, and then dried at 100° C. Thereafter, the substrate was subjected to immersion treatment in a nickel-phosphorus plating solution (phosphorus content: about 10% by weight) set at 80° C. for 1 minute to form a finely protrusion-and-recess-shaped object and a nickel layer serving as a metal layer.

An epoxy-based resin to be formed into an adhesive layer was applied and cured on a surface of the resulting metal layer opposite to the alumina layer having the fine protrusion-and-recess shape. A PET film serving as a substrate of a heat storage member was bonded with the adhesive layer. Then the quartz glass substrate was removed. The substrate was bonded to a quartz cell containing water serving as a heat storage material.

Observation of Cross-Sectional Shape

Figure 4:
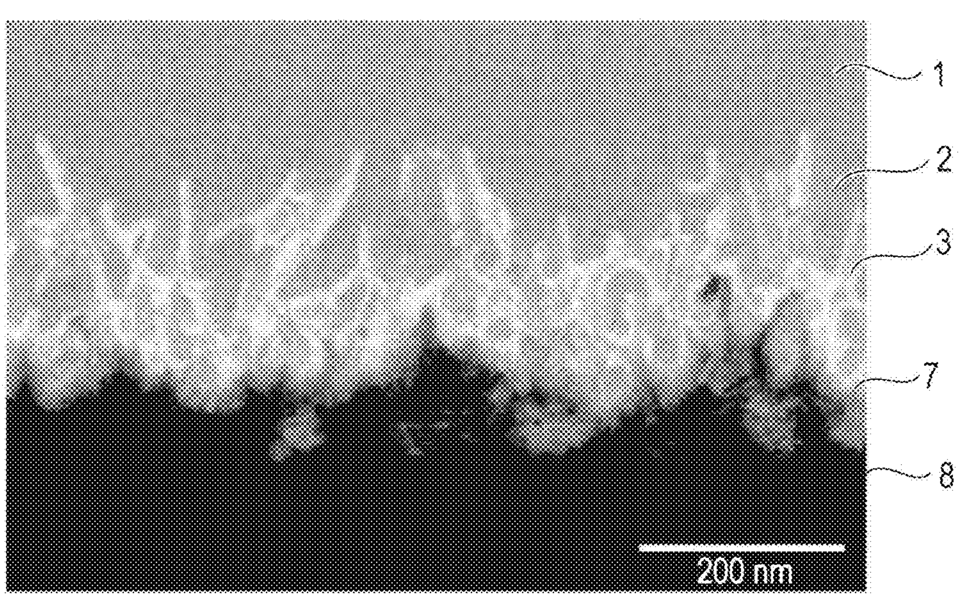
FIG. 4 is an electron micrograph of a partial cross section of a heat storage device obtained in Example 1.

A dicing saw was used to cut the resulting sample including the nickel layer formed on the alumina layer having fine protrusion-and-recess shape obtained in Example 1 described above. Subsequently, thinning in the cross-sectional direction was performed by a focused ion beam (FIB) method. The cross section was observed by SEM. Cross-sectional observation was performed using a scanning transmission electron microscope (trade name: HD-2300, available from Hitachi High-Technologies Corporation). The observation image illustrated in FIG. 4 indicates that the finely protrusion-and-recess-shaped object 2 composed of nickel is disposed so as to fill the gaps of the plate-like alumina crystals, which correspond to the fine protrusion-and-recess shape 3 of the metal oxide formed from the alumina gel film on the base substrate 8, and the nickel layer, which corresponds to the metal layer 1, is present on the finely protrusion-and-recess-shaped object 2.

In Example 1, the average height of the finely protrusion-and-recess-shaped object 2 was 323 nm, the average height of the fine protrusion-and-recess shape 3 was 255 nm, and the thickness of the aluminum-containing film 7 was 68 nm. The average surface roughness Ra' of the surface was 1.0 nm, and the specific surface area was 1.0.

Evaluation

Figure 5:
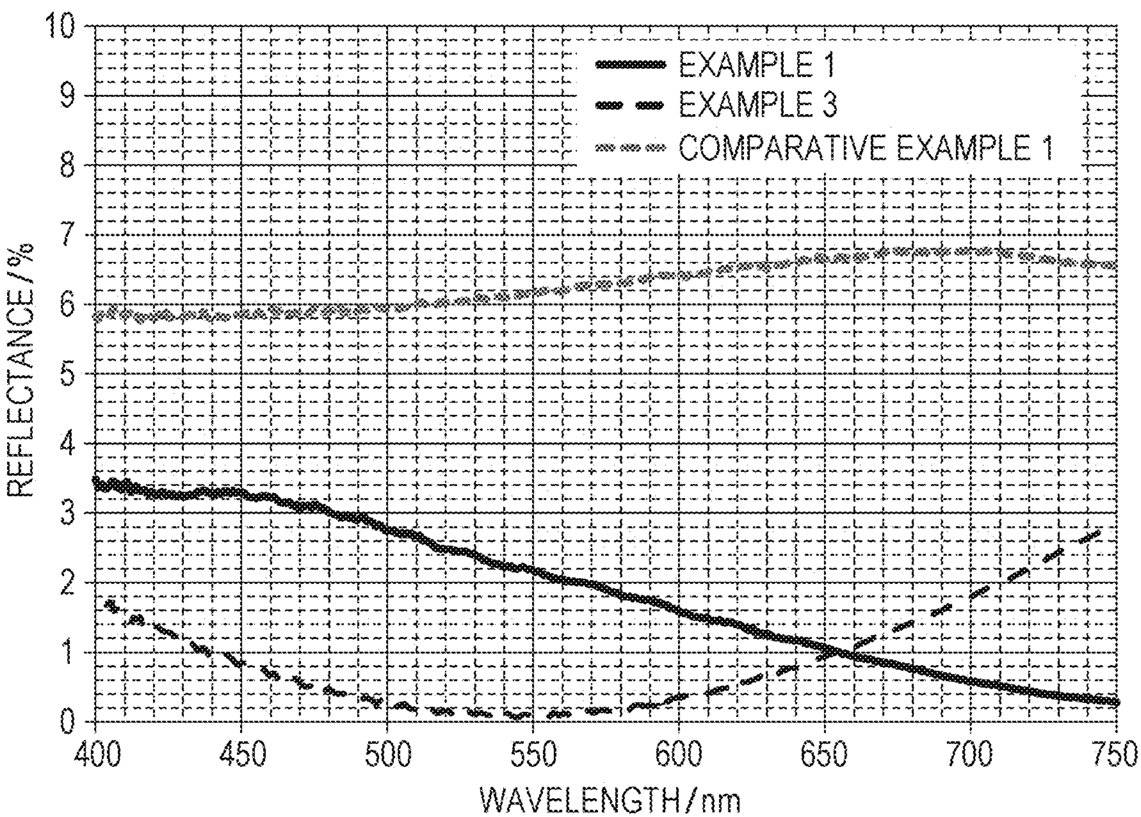
FIG. 5 indicates measurement results of reflectance spectra in the visible light region of heat storage devices obtained in Examples 1 and 3 and the heat storage device obtained in Comparative example 1.
Figure 6:
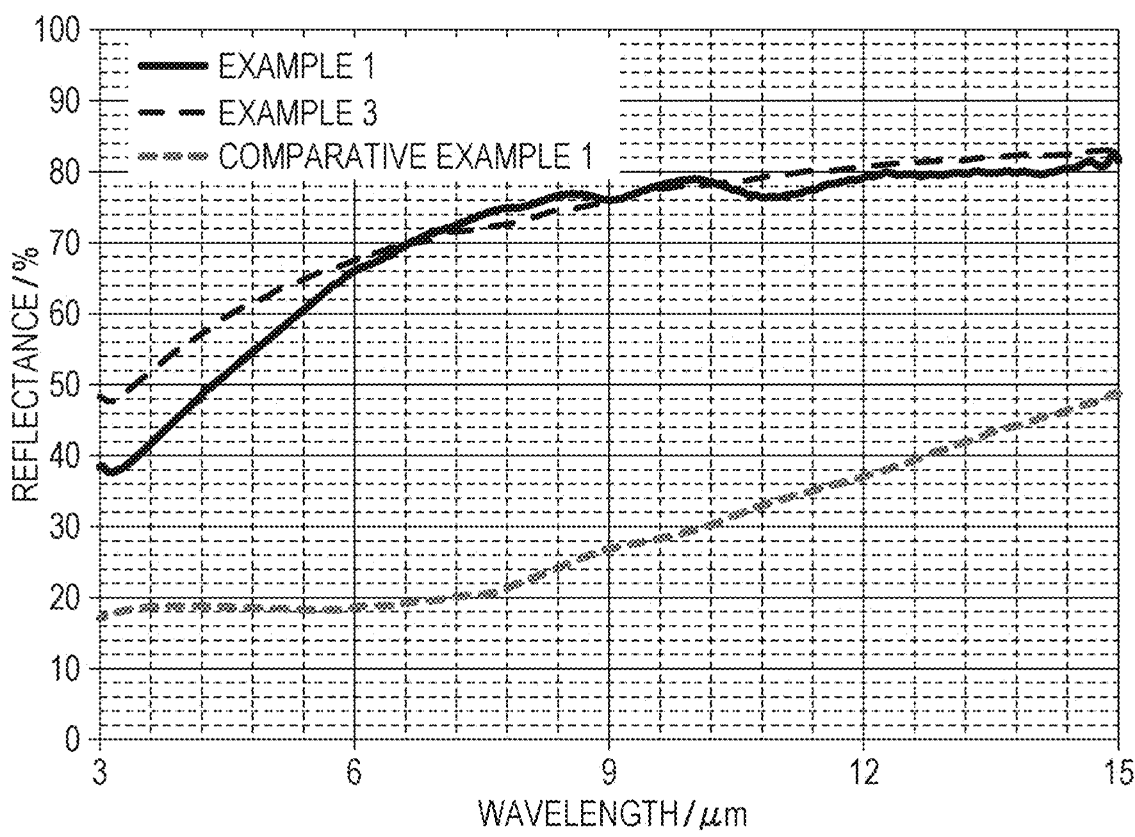
FIG. 6 indicates measurement results of reflectance spectra in the infrared region of heat storage devices obtained in Examples 1 and 3 and a heat storage device obtained in Comparative example 1.

With regard to Example 1, a reflectance spectrum in the visible light region and a reflectance spectrum in the infrared region were measured. The reflectance spectrum measurement was performed using a lens reflectance measuring device (trade name: USPM-RU III, available from Olympus Corporation), and the reflectance spectrum measurement in the infrared region was performed using a Fourier transform infrared spectrophotometer (trade name: FT/IR-6600, available from JASCO Corporation). The results of the reflectance spectrum measurement in the visible light region are illustrated in FIG. 5. The results of the reflectance spectrum measurement in the infrared region are illustrated in FIG. 6. Table 1 presents the reflectances in the visible light region and the infrared region obtained by the reflectance spectrum measurement in the visible light region and the infrared region in Example 1. From FIG. 5, it can be said that in Example 1, the reflectance in the visible light region is low and therefore the light absorption properties are excellent.

From FIG. 6, it can be said that in Example 1, the reflectance increases toward longer wavelengths in the mid-infrared and far-infrared regions and therefore the heat storage properties are excellent.

Comparative Example 1

A sample was produced in the same manner as described in Non Patent Literature 1. For this sample, the reflectance spectrum in the visible light region and the reflectance spectrum in the infrared region were measured under the same conditions as the sample of Example 1. The results are presented in FIGS. 5 and 6 and Table 1.

As illustrated in FIG. 5, in Comparative example 1, the reflectance in the visible to near-infrared region was low, but was inferior to that of the sample of Example 1.

As illustrated in FIG. 6, the sample of Comparative example 1 was inferior to that of Example 1 in reflectance in the mid-infrared region and the far-infrared region.

Example 2

An alumina sol solution was prepared in the same manner as in Example 1. This solution was applied onto a quartz glass substrate as a base substrate by a spin coating method to form a coating film. Thereafter, the coating film was heat-treated at 100° C. for 1 hour to provide a transparent alumina gel film. The alumina gel film was immersed in hot water at 80° C. for 30 minutes and then dried at 100° C. for 10 minutes to form an alumina layer having a fine protrusion-and-recess shape.

An aqueous palladium chloride solution was applied onto the alumina layer having the fine protrusion-and-recess shape by a spin coating method, and then dried at room temperature. Thereafter, the substrate was subjected to immersion treatment in a nickel-phosphorus plating solution (phosphorus content: about 10% by weight) set at 80° C. for 20 minutes to form a finely protrusion-and-recess-shaped object and a nickel layer serving as a metal layer.

Then the quartz glass substrate was removed. The overall film thickness obtained was about 10 μm. The average height of the finely protrusion-and-recess-shaped object of the resulting film was 303 nm, the average height of the fine protrusion-and-recess shape was 233 nm, and the thickness of the aluminum-containing film was 70 nm. The average surface roughness Ra' of the film was 1.0 nm, and the specific surface area was 1.0.

Hereinafter, in Examples 3 to 11, films were produced at different numbers of gel films stacked and under different etching conditions.

Example 3

Figure 7:
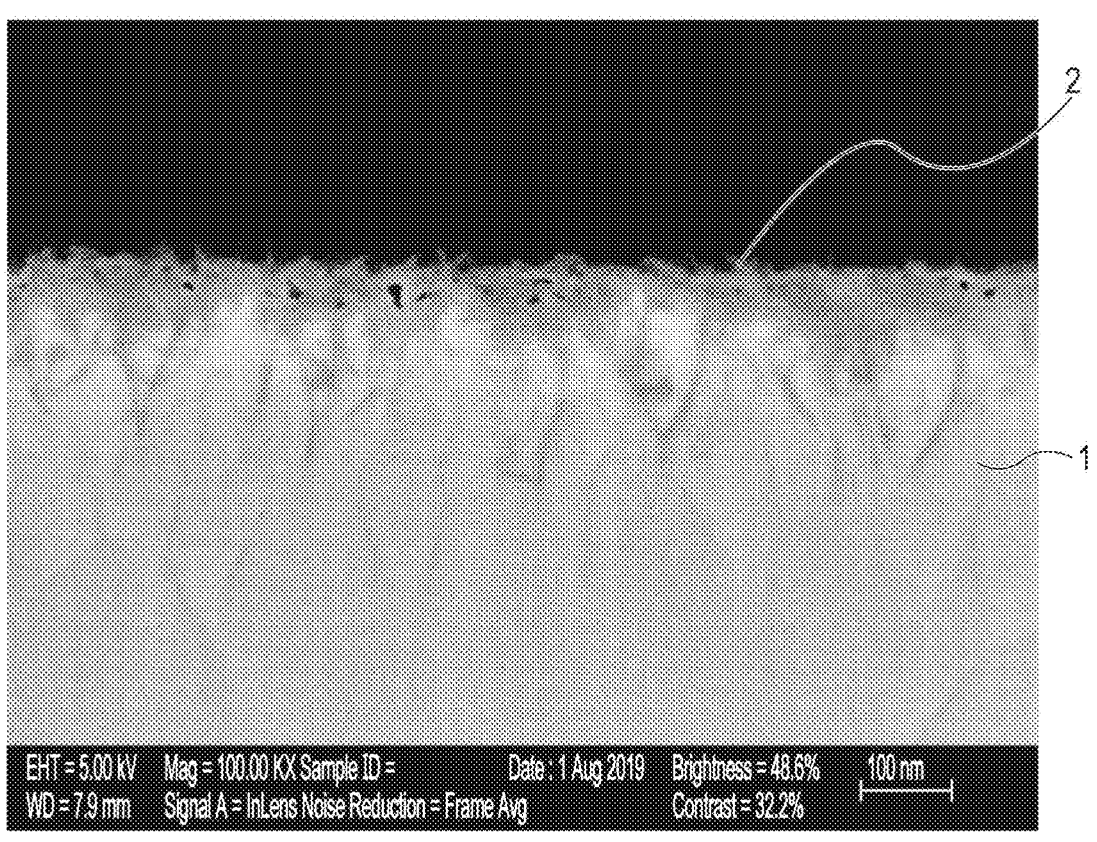
FIG. 7 is an electron micrograph of a cross section of a heat storage device obtained in Example 3.

A film was produced in the same manner as in Example 2. As an etching step, the film peeled off from the quartz glass substrate was subjected to etching treatment at room temperature for 50 hours using a 3 M aqueous sodium hydroxide solution, thereby producing a film. The average height of the finely protrusion-and-recess-shaped object of the resulting film was 251 nm, the average height of the fine protrusion-and-recess shape was 213 nm, the average surface roughness Ra' was 5.0 nm, and the specific surface area was 1.1. The results of the reflectance spectrum measurement in the visible light region are illustrated in FIG. 5. The results of the reflectance spectrum measurement in the infrared region are illustrated in FIG. 6. A cross section was obtained by an FIB method, and the cross section was observed by SEM. The section was observed with a scanning electron microscope (trade name: Ultra55, available from Carl Zeiss). From the observation image illustrated in FIG. 7, the finely protrusion-and-recess-shaped object 2 of nickel was disposed on the nickel layer as the metal layer 1, and a small amount of alumina remained on the finely protrusion-and-recess-shaped object 2. In the alumina layer detected by the SEM-EDX analysis and the XPS measurement, from the surface toward the inside of the cross section in the thickness direction, the proportion of the Al element relatively decreased, whereas the proportion of the Ni element increased.

Example 4

A film was produced as in Example 3, except that in the etching step, the etching treatment was performed at room temperature for 47 hours using a 7.5 M aqueous sodium hydroxide solution. The average height of the finely protrusion-and-recess-shaped object of the resulting film was 235 nm, the average surface roughness Ra' was 18 nm, and the specific surface area was 1.4.

Example 5

A film was produced in the same manner as in Example 3, except that a nickel-phosphorus plating solution (phosphorus content: about 1% to 2% by weight) was used as the plating solution. The average height of the finely protrusion-and-recess-shaped object of the resulting film was 272 nm, the average surface roughness Ra' was 3.8 nm, and the specific surface area was 1.1.

Example 6

An alumina sol solution was prepared as in Example 2 and applied onto a quartz glass substrate as a base substrate by a spin coating method, thereby forming a coating film. Thereafter, the coating film was heat-treated at 100° C. for 1 hour. The same application and drying process for the film was repeated again, and the number of alumina gel films stacked was two. Thereby, as an aluminum-containing film, the transparent alumina gel films were obtained. Thereafter, a film was produced in the same manner as in Example 2. The average height of the finely protrusion-and-recess-shaped object of the resulting film was 371 nm, the average height of the fine protrusion-and-recess shape was 306 nm, the average surface roughness Ra' was 1.1 nm, and the specific surface area was 1.0.

Example 7

A film was produced as in Example 6, except that, after the metal film including the alumina layer was peeled off from the quartz glass substrate, etching treatment was performed at room temperature for 50 hours using a 3 M aqueous sodium hydroxide solution, as the etching step. The average height of the finely protrusion-and-recess-shaped object of the resulting film was 315 nm, the average surface roughness Ra' was 10 nm, and the specific surface area was 1.2.

Example 8

A film was produced as in Example 7, except that in the etching step, the etching treatment was performed at room temperature for 50 hours using a 7.5 M aqueous sodium hydroxide solution. The average height of the finely protrusion-and-recess-shaped object of the resulting film was 303 nm, the average surface roughness Ra' was 27 nm, and the specific surface area was 1.7.

Example 9

A film was produced as in Example 2, except that the number of alumina gel films stacked was three. The average height of the finely protrusion-and-recess-shaped object of the resulting film was 419 nm, the average height of the fine protrusion-and-recess shape was 374 nm, the average surface roughness Ra' was 1.2 nm, and the specific surface area was 1.0.

Example 10

A film was produced as in Example 9, except that, after the metal film including the alumina layer was peeled off from the quartz glass substrate, etching treatment was performed at room temperature for 50 hours using a 3 M aqueous sodium hydroxide solution, in the etching step. The average height of the finely protrusion-and-recess-shaped object of the resulting film was 354 nm, the average surface roughness Ra' was 16 nm, and the specific surface area was 1.3.

Example 11

A film was produced as in Example 10, except that in the etching step, the etching treatment was performed at room temperature for 45 hours using a 6 M aqueous sodium hydroxide solution. The average height of the finely protrusion-and-recess-shaped object of the resulting film was 346 nm, the average surface roughness Ra' was 35 nm, and the specific surface area was 2.1.

Table 1 presents the reflectances in the visible light region and the infrared region obtained by the measurement of the reflection spectra in the visible light region and the infrared region of the samples produced in Examples 1 to 11 and Comparative example 1.

TABLE 1

| | Reflectance (%) | | | | | |
|---|---|---|---|---|---|---|
| | Visible light region | | | Far-infrared region | | |
| Example No. | 450 nm | 550 nm | 650 nm | 3 μm | 5 μm | 10 μm |
| Example 1 | 3.2 | 2.2 | 1.0 | 38 | 57 | 79 |
| Example 2 | 5.0 | 2.9 | 1.1 | 46 | 64 | 80 |
| Example 3 | 0.9 | 0.1 | 1.0 | 49 | 63 | 78 |
| Example 4 | 0.5 | 0.1 | 0.4 | 55 | 76 | 87 |
| Example 5 | 4.6 | 2.2 | 1.6 | 62 | 77 | 88 |
| Example 6 | 6.0 | 5.5 | 5.6 | 18 | 50 | 73 |
| Example 7 | 1.0 | 0.6 | 0.5 | 36 | 59 | 80 |
| Example 8 | 0.6 | 0.5 | 0.6 | 42 | 70 | 86 |

TABLE 1-continued

| | Reflectance (%) | | | | | |
|---|---|---|---|---|---|---|
| | Visible light region | | | Far-infrared region | | |
| Example No. | 450 nm | 550 nm | 650 nm | 3 μm | 5 μm | 10 μm |
| Example 9 | 7.9 | 2.1 | 3.3 | 7 | 44 | 71 |
| Example 10 | 0.7 | 0.9 | 1.1 | 36 | 59 | 80 |
| Example 11 | 0.8 | 1.0 | 1.2 | 40 | 68 | 85 |
| Comparative example 1 | 5.8 | 6.2 | 6.6 | 17 | 18 | 29 |

Evaluation of Heat Storage Properties

Example 12

A sample was produced as in Example 1, in which 40 ml of water was placed in a quartz cell measuring 10 mm×10 mm×45 mm. The sample left at room temperature (25° C.) was irradiated with a 150-W halogen lamp at a distance of 10 mm. After the irradiation with the halogen lamp was stopped, the water was left for 10 minutes, and the temperature of the water was measured with a thermocouple. Table 2 presents the results.

Comparative Example 2

A sample was produced as in Example 12, except that the light-absorbing material of Comparative example 1 was used. The sample was similarly evaluated. Table 2 presents the results.

TABLE 2

| | Heat storage material | Temperature [° C.] |
|---|---|---|
| Example 12 | water | 55 |
| Comparative example 2 | water | 52 |

Since the temperature increased by irradiation with the same energy was higher in Example 12 than in Comparative Example 2, it was found that heat was stored more efficiently.

From the above, it was found that the heat storage device of the present invention was excellent in both of the light absorption properties and the heat storage properties.

According to the present invention, it is possible to provide the light-absorbing heat-storing film and the heat storage member that absorb visible light and near-infrared light (low reflectance) and that have low radiation of far-infrared light (high reflectance), which are normally incompatible. The light-absorbing heat-storing film and the heat storage member of the present invention can be used as heat storage members for space-related devices, such as artificial satellites, and solar thermal power generation, and can also be used for exterior films, solar collectors, and so forth.

According to the present invention, the use of the metal layer having the protrusion-and-recess-shaped object makes it possible to provide the heat storage device having light absorption and heat storage properties, which are normally incompatible.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

The invention claimed is:

1. A heat storage device, comprising:

a heat storage member;

a metal layer disposed over and bonded to the heat storage member, the metal layer containing a protrusion-and-recess-shaped object;

a metal oxide in contact with the protrusion-and-recess-shaped object; and a transparent metal oxide layer covering a surface of the metal oxide on which the metal oxide is not in contact with the protrusion-and-recess-shaped object, wherein the protrusion-and-recess-shaped object has a height of 100 nm or more and 1,000 nm or less.

2. The heat storage device according to claim 1, wherein the heat storage member contains any one of water, paraffin, oil, fibers, sand, and salts.

3. The heat storage device according to claim 1, wherein the metal oxide contains a plate-like crystal containing alumina as a main component.

4. The heat storage device according to claim 1, wherein the heat storage device has a surface with an average surface roughness Ra' of 1 nm or more and 50 nm or less, and has a specific surface area Sr of 1.0 or more and 3.0 or less.

5. The heat storage device according to claim 1, wherein a material of the metal layer contains any one selected from nickel, chromium, and zinc.

6. The heat storage device according to claim 1, wherein the metal layer is bonded to the heat storage member with an adhesive layer.

7. The heat storage device according claim 1, wherein the heat storage member contains a heat storage material and a substrate disposed between the metal layer and the heat storage material.

8. The heat storage device according to claim 7, wherein the substrate is composed of any one of metals, glass, ceramic materials, wood, paper, and resins.

9. An article, comprising the heat storage device according to claim 1; and a heat insulator.

10. An article, comprising the heat storage device according to claim 1; and a heat dissipation device.

11. The article according to claim 10, wherein at least one of deformation or displacement is performed so as to store heat in the heat storage device when a predetermined portion of the article has a temperature of lower than a predetermined temperature and so as to dissipate heat from the heat dissipation device when the predetermined portion has a temperature equal to or higher than the predetermined temperature.

12. An article, comprising the heat storage device according to claim 1; and a medium to be heated by the heat storage device.

13. An artificial satellite, comprising the heat storage device according to claim 1.

14. A solar heat utilization system, comprising the heat storage device according to claim 1.

15. A solar photovoltaic power generation system, comprising the heat storage device according to claim 1.

16. The solar photovoltaic power generation system according to claim 15, further comprising a heat insulator; and a solar photovoltaic power generation cell disposed between the heat storage device and the heat insulator.

17. The heat storage device according to claim 1, wherein the transparent metal oxide layer contains an amorphous gel of alumina.

* * * * *